(12) United States Patent
Sommer

(10) Patent No.: US 8,652,417 B2
(45) Date of Patent: Feb. 18, 2014

(54) CRYSTALLIZATION MEDIA

(75) Inventor: Morten Sommer, Boston, MA (US)

(73) Assignee: Microlytic APS, Roskilde (DK)

( * ) Notice: Subject to any disclaimer, the term of this patent is extended or adjusted under 35 U.S.C. 154(b) by 105 days.

(21) Appl. No.: 13/010,298

(22) Filed: Jan. 20, 2011

(65) Prior Publication Data

US 2011/0175033 A1 Jul. 21, 2011

Related U.S. Application Data

(60) Provisional application No. 61/297,027, filed on Jan. 21, 2010.

(51) Int. Cl.
*G01N 33/00* (2006.01)

(52) U.S. Cl.
USPC ............. 422/430; 506/13; 436/86; 422/245.1

(58) Field of Classification Search
USPC .................. 422/430, 245.1; 506/13; 436/86
See application file for complete search history.

(56) References Cited

U.S. PATENT DOCUMENTS

| | | |
|---|---|---|
| 6,267,935 B1 | 7/2001 | Hol et al. |
| 6,409,832 B2 | 6/2002 | Weigl et al. |
| 6,599,441 B1 * | 7/2003 | Chrislip et al. ............ 422/245.1 |
| 6,719,840 B2 * | 4/2004 | David et al. ................ 422/245.1 |
| 6,916,455 B2 * | 7/2005 | Segelke et al. ............. 422/245.1 |
| 2003/0061687 A1 | 4/2003 | Hansen et al. |

FOREIGN PATENT DOCUMENTS

| | | |
|---|---|---|
| EP | 1 119 654 | 8/2001 |
| WO | WO 2008/000276 | 1/2008 |

OTHER PUBLICATIONS

Summer, U.S. Appl. No. 61/154,527, entitled "Crystallization System and a Method for Promoting Crystallization" filed Feb. 23, 2009.
Summer, U.S. Appl. No. 61/169,987, entitled "Device and a Method for Promoting Crystallization" filed Apr. 16, 2009.

* cited by examiner

*Primary Examiner* — Monique Cole
(74) *Attorney, Agent, or Firm* — Buchanan Ingersoll & Rooney PC

(57) ABSTRACT

A set of crystallization solutions includes a plurality of crystallization solutions of Crystallization Solution Set I, a plurality of crystallization solutions of Crystallization Solution Set II or a plurality of crystallization solutions of Crystallization Solution Set III.

9 Claims, 11 Drawing Sheets

Table I. Crystallization Solution Set I

| No. # | % w/v | Polymer | mM | Salt | Conc | Additive | pH | mM | Buffer |
|---|---|---|---|---|---|---|---|---|---|
| 1 | | | | | | | 3,5 | 20 | Citric acid |
| 2 | | | | | | | 5 | 25 | Ammonium citrate |
| 3 | | | | | | | 6 | 30 | Magnesium formate |
| 4 | | | | | | | 6,5 | 25 | BIS-TRIS |
| 5 | | | | | | | 7 | 25 | Potassium nitrate |
| 6 | | | | | | | 7,5 | 25 | HEPES |
| 7 | | | | | | | 8 | 20 | TRIS |
| 8 | | | | | | | 9 | 35 | BIS-TRIS propane |
| 9 | | | | | | ethanol | 4,5 | 20 | Sodium acetate trihydrate |
| 10 | | | | | 50 %v/v | MPD | 5,5 | 25 | Sodium citrate tribasic dihydrate |
| 11 | | | | | 20 %v/v | 2-propanol | 6 | 30 | Magnesium formate |
| 12 | | | | | 40 %v/v | t-butanol | 6,5 | 25 | Sodium cacodylate trihydrate |
| 13 | | | | | 30 % v/v | 2-propanol | 7 | 25 | Imidazole |
| 14 | | | | | 5 % v/v | 1-hexanol | 7,5 | 25 | Potassium formate |
| 15 | | | | | 30%v/v | 1-pentanol | 8,5 | 20 | BICINE |
| 16 | | | | | 15% v/v | glycerol | 9,5 | 35 | CHES |
| 17 | | | 30 | Sodium chloride | | | 7,5 | 10 | HEPES |
| 18 | | | 25 | Potassium chloride | | | 8 | 10 | TRIS |
| 19 | | | 20 | Magnesium sulfate | | | 8,5 | 10 | BICINE |
| 20 | | | 10 | Ammonium sulfate | | | 6,5 | 10 | BIS-TRIS |
| 21 | | | 10 | Sodium citrate | | | 5 | 10 | Ammonium citrate |
| 22 | | | 15 | Lithium chloride | | | 4,5 | 10 | Sodium acetate trihydrate |

Fig. 1a

| No. # | % w/v | Polymer | mM | Salt | Conc | Additive | pH | mM | Buffer |
|---|---|---|---|---|---|---|---|---|---|
| 23 | | | 15 | Potassium phosphate | | | 7 | 10 | Potassium nitrate |
| 24 | | | 20 | Ammonium acetate | | | 5,5 | 10 | Sodium citrate tribasic dihydrate |
| 25 | | | | | | | | | |
| 26 | | | | | | | 6,5 | 2 | Sodium cacodylate trihydrate |
| 27 | | | | | | | 4,5 | 2 | Sodium acetate trihydrate |
| 28 | | | | | | | 6 | 2 | MES monohydrate |
| 29 | | | | | | | 7 | 2 | Imidazole |
| 30 | | | | | | | 3,5 | 2 | BICINE |
| 31 | | | | | | | 9,5 | 2 | CHES |
| 32 | | | | | | | 9 | 2 | BIS-TRIS |
| 33 | | | 10 | Ammonium nitrate | 50 % v/v | ethanol | 3,5 | 15 | Citric acid |
| 34 | | | 15 | Calcium acetate | 5 % v/v | MPD | 5 | 15 | Ammonium citrate |
| 35 | | | 15 | Magnesium chloride hexahydrate | 15%v/v | dioxane | 6 | 15 | MES monohydrate |
| 36 | | | 20 | Magnesium sulfate heptahydrate | 15% v/v | t-butanol | 6,5 | 15 | BIS-TRIS propane |
| 37 | | | 30 | Potassium tartrate | 10%v/v | dioxane | 7 | 15 | Potassium nitrate |
| 38 | | | 25 | Sodium formate | 5 %v/v | 1-hexanol | 7,5 | 15 | HEPES |
| 39 | | | 20 | Sodium thiocyanate | 20 %v/v | 1-pentanol | 8 | 15 | TRIS |
| 40 | | | 10 | Zinc sulfate heptahydrate | 40 %v/v | glycerol | 9 | 15 | BIS-TRIS propane |
| 41 | | | | | 50 %v/v | ethanol | | | |
| 42 | | | | | 50 %v/v | MPD | | | |
| 43 | | | | | 50 %v/v | 2-propanol | | | |
| 44 | | | | | 50 %v/v | t-butanol | | | |

Fig. 1b

| No. # | % w/v | Polymer | mM | Salt | Conc | Additive | pH | mM | Buffer |
|---|---|---|---|---|---|---|---|---|---|
| 45 | | | | | 5 % v/v | dioxane | | | |
| 46 | | | | | 15 %v/v | 1-hexanol | | | |
| 47 | | | | | 50 %v/v | 1-pentanol | | | |
| 48 | | | | | 50 %v/v | glycerol | | | |
| 49 | 8 | PEG 4000 | | | | | 4,6 | 100 | Sodium acetate trihydrate |
| 50 | 8 | PEG 8000 | | | | | 8,5 | 100 | TRIS |
| 51 | 5 | PEG 1000 | | | 40% v/v | Ethanol | 5,2 | 100 | Citric acid |
| 52 | 5 | PEG 8000 | | | 40% v/v | MPD | 7 | 100 | Sodium cacodylate trihydrate |
| 53 | 2 | PEG 400 | 2000 | Ammonium sulfate | | | 7,5 | 100 | HEPES |
| 54 | | | 1400 | Sodium citrate tribasic (H2O)2 | | | 7,5 | 100 | HEPES |
| 55 | | | 2000 | Ammonium sulfate | | | 8,5 | 100 | TRIS |
| 56 | | | 200 | Ammonium phosphate monobasic | 50% v/v | MPD | 8,5 | 100 | TRIS |
| 57 | | | 800 | Ammonium sulfate | | | 4 | 100 | Citric acid |
| 58 | | | | | 30 % v/v | t-butanol | 4,6 | 100 | Sodium acetate trihydrate |
| 59 | | | 1000 | Ammonium phosphate monobasic | | | 5,6 | 100 | Sodium citrate tribasic dihydrate |
| 60 | | | 1500 | Lithium sulfate | | | 7,5 | 100 | HEPES |
| 61 | | | 200 | Magnesium acetate (H2O)4 | 30% v/v | MPD | 6,5 | 100 | Sodium cacodylate trihydrate |
| 62 | | | 4000 | Sodium formate | | | | | |
| 63 | | | 2000 | Sodium formate | | | 4,6 | 100 | Sodium acetate trihydrate |

Fig. 1c

| No # | % w/v | Polymer | mM | Salt | Conc | Additive | pH | mM | Buffer |
|---|---|---|---|---|---|---|---|---|---|
| 64 | | | | | | | 6,5 | 1600 | Sodium citrate tribasic dihydrate |
| 65 | | | 800 | Sodium phosphate monobasic (H2O) | 800 mM | Potassium phosphate monobasic | 7,5 | 100 | HEPES |
| 66 | 10 | PEG 400 | 200 | Lithium sulfate | | | 5,1 | 100 | Sodium acetate trihydrate |
| 67 | 8 | PEG 4000 | 200 | Magnesium chloride | | | 8,5 | 100 | TRIS |
| 68 | 9 | PEG 3000 | | | | | 5,5 | 100 | Sodium citrate tribasic dihydrate |
| 69 | 10 | PEG 1000 | 200 | Ammonium acetate | | | 4,6 | 100 | Sodium acetate trihydrate |
| 70 | 7 | PEG 3350 | | | | | 5 | 100 | Ammonium citrate |
| 71 | 5 | PEG 8000 | | | | | 6,5 | 100 | Sodium cacodylate trihydrate |
| 72 | 5 | PEG 6000 | 1000 | Lithium chloride | | | 4 | 100 | Citric acid |
| 73 | 5 | PEG 400 | 300 | DL- malic acid | | | 6,5 | 100 | Sodium cacodylate trihydrate |
| 74 | 5 | PEG 1000 | 300 | Magnesium acetate tetrahydrate | | | 3,5 | 100 | Citric acid |
| 75 | 5 | PEG 3350 | 300 | Potassium phosphate monobasic | | | 8 | 100 | TRIS |
| 76 | 5 | PEG 4000 | 300 | Sodium bromide | | | 6,5 | 100 | Sodium cacodylate trihydrate |
| 77 | 5 | PEG 6000 | 300 | Sodium fluoride | | | 9,5 | 100 | CHES |

Fig. 1d

| No. # | % w/v | Polymer | mM | Salt | Conc | Additive | pH | mM | Buffer |
|---|---|---|---|---|---|---|---|---|---|
| 78 | 5 | PEG 8000 | 300 | Sodium malonate | | | 5,5 | 100 | Sodium citrate tribasic dihydrate |
| 79 | 5 | PEG 400 | 300 | Zinc chloride | | | 6 | 100 | Magnesium formate |
| 80 | 5 | PEG 1000 | | | | | 7 | 100 | Imidazole |
| 81 | 5 | PEG 3350 | 300 | Ammonium formate | | | 7 | 100 | Potassium nitrate |
| 82 | 5 | PEG 4000 | 300 | Calcium acetate | | | 8,5 | 100 | BICINE |
| 83 | 5 | PEG 6000 | 300 | Magnesium chloride hexahydrate | | | 7,5 | 100 | HEPES |
| 84 | 5 | PEG 8000 | 300 | Sodium thiocyanate | | | 6 | 100 | MES monohydrate |
| 85 | | | 20 | Calcium chloride | 30 %w/v | MPD | 4,5 | 100 | Sodium acetate trihydrate |
| 86 | | | | | 20 %v/v | ethanol | 8,5 | 100 | TRIS |
| 87 | | | 100 | sodium/potassium phosphate | 25 %v/v | 1,2-propanediol | 6,5 | 100 | MES monohydrate |
| 88 | | | 2000 | Ammonium sulfate | | | 4,5 | 100 | Sodium acetate trihydrate |
| 89 | | | 200 | Magnesium chloride | 70 %v/v | MPD | 7,5 | 100 | HEPES |
| 90 | | | | | 40 %v/v | MPD | 8,5 | 100 | TRIS |
| 91 | | | 150 | Calcium chloride | 15 %v/v | 2-propanol | 4,5 | 100 | Sodium acetate trihydrate |
| 92 | | | 1000 | sodium citrate | | | 6,5 | 100 | Sodium cacodylate trihydrate |
| 93 | | | 200 | sodium chloride | 10 %v/v | 2-propanol | 7,5 | 100 | HEPES |
| 94 | | | 1250 | Ammonium sulfate | 200 mM | Lithium sulfate | 8,5 | 100 | TRIS |
| 95 | | | | | 10 %v/v | MPD | 9 | 100 | BICINE |
| 96 | | | 200 | Magnesium chloride | 50 %v/v | ethylene glycol | 8,5 | 100 | TRIS |

Fig. 1e

Table II. Crystallization Solution Set II

| No# | Position | Composition | Final pH |
|---|---|---|---|
| 1 | A1 | 0.3 M Ammonium chloride , 0.1 M Citric acid , 22.5% PolyPure PEG 0.3-10 kD | 4 |
| 2 | A2 | 0.3 M Ammonium formate , 0.1 M Potassium nitrate, 22.5% PolyPure PEG 0.3-10 kD | 6,6 |
| 3 | B1 | 0.3 M Ammonium nitrate , 0.1 M Sodium citrate tribasic dihydrate , 22.5% PolyPure PEG 0.3-10 kD | 5,9 |
| 4 | B2 | 0.3 M Ammonium phosphate monobasic, 0.1 M MES monohydrate, 22.5% PolyPure PEG 0.3-10 kD | 5,7 |
| 5 | C1 | 0.3 M Ammonium sulfate , 0.1 M BIS-TRIS , 22.5% PolyPure PEG 0.3-10 kD | 6,8 |
| 6 | C2 | 0.3 M Di-ammonium tartrate , 0.1 M Sodium acetate trihydrate , 22.5% PolyPure PEG 0.3-10 kD | 5,8 |
| 7 | D1 | 0.3 M Cadmium chloride , 0.1 M Sodium acetate trihydrate , 22.5% PolyPure PEG 0.3-10 kD | 3,7 |
| 8 | D2 | 0.3 M Cadmium sulfate , 0.1 M Imidazole , 22.5% PolyPure PEG 0.3-10 kD | 4,6 |
| 9 | E1 | 0.3 M Caesium chloride, 0.1 M HEPES , 22.5% PolyPure PEG 0.3-10 kD | 7,6 |
| 10 | E2 | 0.3 M Calcium acetate , 0.1 M BICINE , 22.5% PolyPure PEG 0.3-10 kD | 6,4 |
| 11 | F1 | 0.3 M Calcium chloride, 0.1 M BIS-TRIS propane , 22.5% PolyPure PEG 0.3-10 kD | 8,5 |
| 12 | F2 | 0.3 M Cobalt(II) chloride hexahydrate, 0.1 M Ammonium citrate, 22.5% PolyPure PEG 0.3-10 kD | 3,2 |
| 13 | G1 | 0.3 M Di-ammonium hydrogen citrate , 0.1 M Magnesium formate, 22.5% PolyPure PEG 0.3-10 kD | 4,9 |
| 14 | G2 | 0.3 M DL- malic acid, 0.1 M Sodium cacodylate trihydrate, 22.5% PolyPure PEG 0.3-10 kD | 2,9 |
| 15 | H1 | 0.3 M Iron(III) chloride hexahydrate , 0.1 M Potassium nitrate , 22.5% PolyPure PEG 0.3-10 kD | 1,1 |
| 16 | H2 | 0.3 M Lithium chloride, 0.1 M Potassium formate, 22.5% PolyPure PEG 0.3-10 kD | 6,3 |
| 17 | A6 | 0.3 M Lithium sulfate monohydrate, 0.1 M CHES, 22.5% PolyPure PEG 0.3-10 kD | 9,5 |
| 18 | A7 | 0.3 M Magnesium acetate tetrahydrate, 0.1 M Citric acid , 22.5% PolyPure PEG 0.3-10 kD | 4,7 |
| 19 | B6 | 0.3 M Magnesium chloride hexahydrate, 0.1 M Sodium cacodylate trihydrate, 22.5% PolyPure PEG 0.3-10 kD | 5,8 |
| 20 | B7 | 0.3 M Magnesium nitrate hexahydrate, 0.1 M HEPES , 22.5% PolyPure PEG 0.3-10 kD | 7,4 |
| 21 | C6 | 0.3 M Magnesium sulfate heptahydrate, 0.1 M Potassium formate, 22.5% PolyPure PEG 0.3-10 kD | 6,1 |
| 22 | C7 | 0.3 M Nickel(II) chloride hexahydrate, 0.1 M MES monohydrate , 22.5% PolyPure PEG 0.3-10 kD | 5,7 |
| 23 | D6 | 0.3 M Potassium bromide, 0.1 M BIS-TRIS , 22.5% PolyPure PEG 0.3-10 kD | 6,6 |

Fig. 2a

| No# | Position | Composition | Final pH |
|---|---|---|---|
| 24 | D7 | 0.3 M Potassium phosphate monobasic, 0.1 M Tris, 22.5% PolyPure PEG 0.3-10 kD | 6,1 |
| 25 | E6 | 0.3 M Potassium sodium tartrate tetrahydrate, 0.1 M BICINE, 22.5% PolyPure PEG 0.3-10 kD | 8,8 |
| 26 | E7 | 0.3 M Potassium tartrate, 0.1 M Imidazole, 22.5% PolyPure PEG 0.3-10 kD | 7,3 |
| 27 | F6 | 0.3 M Potassium thiocyanate, 0.1 M Ammonium citrate, 22.5% PolyPure PEG 0.3-10 kD | 5,8 |
| 28 | F7 | 0.3 M Sodium bromide, 0.1 M Sodium cacodylate trihydrate, 22.5% PolyPure PEG 0.3-10 kD | 6,5 |
| 29 | G6 | 0.3 M Sodium chloride, 0.1 M Tris, 22.5% PolyPure PEG 0.3-10 kD | 8,1 |
| 30 | G7 | 0.3 M Sodium fluoride, 0.1 M CHES, 22.5% PolyPure PEG 0.3-10 kD | 9,6 |
| 31 | H6 | 0.3 M Sodium formate, 0.1 M Citric acid, 22.5% PolyPure PEG 0.3-10 kD | 4,5 |
| 32 | H7 | 0.3 M Sodium iodide, 0.1 M Sodium acetate trihydrate, 22.5% PolyPure PEG 0.3-10 kD | 4,7 |
| 33 | A11 | 0.3 M Sodium malonate, 0.1 M Sodium citrate tribasic dihydrate, 22.5% PolyPure PEG 0.3-10 kD | 6,8 |
| 34 | A12 | 0.3 M Sodium nitrate, 0.1 M MES monohydrate, 22.5% PolyPure PEG 0.3-10 kD | 6,1 |
| 35 | B11 | 0.3 M Sodium phosphate monobasic monohydrate, 0.1 M BIS-TRIS, 22.5% PolyPure PEG 0.3-10 kD | 5,8 |
| 36 | B12 | 0.3 M Sodium sulfate, 0.1 M BIS-TRIS propane, 22.5% PolyPure PEG 0.3-10 kD | 9,3 |
| 37 | C11 | 0.3 M Sodium thiocyanate, 0.1 M HEPES, 22.5% PolyPure PEG 0.3-10 kD | 7,8 |
| 38 | C12 | 0.3 M Succinic acid, 0.1 M Imidazole, 22.5% PolyPure PEG 0.3-10 kD | 3,4 |
| 39 | D11 | 0.3 M Tri-methylamine N-oxide, 0.1 M BICINE, 22.5% PolyPure PEG 0.3-10 kD | 8,6 |
| 40 | D12 | 0.3 M Tri-potassium citrate, 0.1 M BIS-TRIS propane, 22.5% PolyPure PEG 0.3-10 kD | 9,8 |
| 41 | E11 | 10 % Jeffamine M-600, 0.1 M HEPES, 22.5% PolyPure PEG 0.3-10 kD | 7,5 |
| 42 | E12 | 0.3 M Zinc chloride, 0.1 M Magnesium formate, 22.5% PolyPure PEG 0.3-10 kD | 5,7 |
| 43 | F11 | 0.3 M Zinc sulfate heptahydrate, 0.1 M Sodium citrate tribasic dihydrate, 22.5% PolyPure PEG 0.3-10 kD | 4 |
| 44 | F12 | 0.1 M CHES, 22.5% PolyPure PEG 0.3-10 kD | 9,9 |
| 45 | G11 | 0.1 M Imidazole, 22.5% PolyPure PEG 0.3-10 kD | 6,6 |
| 46 | G12 | 0.1 M Magnesium formate, 22.5% PolyPure PEG 0.3-10 kD | 5,9 |
| 47 | H11 | 0.1 M Sodium acetate trihydrate, 22.5% PolyPure PEG 0.3-10 kD | 4,7 |
| 48 | H12 | 0.1 M Tris, 22.5% PolyPure PEG 0.3-10 kD | 8,1 |

Fig. 2b

Table III. Crystallization Solution Set III

| No. # | % w/v | Polymer | M | Salt | M | Buffer | pH | M | Conc | Additive |
|---|---|---|---|---|---|---|---|---|---|---|
| 1 | 50 | PEG 400 | 0,2 | Lithium sulfate | | sodium acetate (H2O)3 | 5,1 | 0,1 | | |
| 2 | 30 | PEG 4000 | 0,2 | Magnesium chloride | | TRIS | 8,5 | 0,1 | | |
| 3 | 20 | PEG 3000 | | | | sodium citrate | 5,5 | 0,1 | | |
| 4 | 30 | PEG 4000 | 0,2 | Ammonium acetate | | sodium acetate (H2O)3 | 4,6 | 0,1 | | |
| 5 | 20 | PEG 3350 | | | | diammonium hydrogen citrate | 5 | 0,2 | | |
| 6 | 20 | PEG 8000 | 0,2 | Magnesium acetate (H2O)4 | | Sodium cacodylate (H2O)3 | 6,5 | 0,1 | | |
| 7 | 20 | PEG 8000 | 0,2 | Sodium chloride | | phosphate citrate | 4,2 | 0,1 | | |
| 8 | | | | Sodium citrate tribasic (H2O)2 | 1,4 | HEPES | 7,5 | 0,1 | | |
| 9 | 20 | PEG 3350 | | | | Magnesium formate | 5,9 | 0,2 | | |
| 10 | 2 | PEG 400 | 2 | Ammonium sulfate | | HEPES | 7,5 | 0,1 | | |
| 11 | 20 | PEG 1000 | 0,2 | Lithium sulfate | | phosphate citrate | 4,2 | 0,1 | | |
| 12 | 30 | PEG 1500 | | | | | | | | |

Fig. 3a

| No. # | % w/v | Polymer | M | Salt | pH | M | Buffer | Conc | Additive |
|---|---|---|---|---|---|---|---|---|---|
| 13 | 20 | PEG 8000 | | | 9,5 | 0,1 | CHES | | |
| 14 | | | 2 | Ammonium sulfate | 8,5 | 0,1 | TRIS | | |
| 15 | 20 | PEG 3350 | | | 6,6 | 0,2 | Ammonium formate | | |
| 16 | 30 | PEG 4000 | 0,2 | Lithium sulfate | 8,5 | 0,1 | TRIS | | |
| 17 | 20 | PEG 3350 | | | 6,3 | 0,2 | Ammonium chloride | | |
| 18 | 30 | PEG 8000 | 0,2 | Ammonium sulfate | | | | | |
| 19 | 20 | PEG 3350 | | | 7,3 | 0,2 | potassium formate | | |
| 20 | 8 | PEG 8000 | | | 8,5 | 0,1 | TRIS | | |
| 21 | | | 0,2 | Ammonium phosphate monobasic | 8,5 | 0,1 | TRIS | 50% v/v | MPD |
| 22 | 20 | PEG 4000 | | | 7,5 | 0,1 | HEPES | 10% v/v | 2-propanol |
| 23 | 20 | PEG 3350 | | | 6,9 | 0,2 | potassium nitrate | | |
| 24 | 18 | PEG 8000 | 0,2 | Zinc acetate (H2O)2 | 6,5 | 0,1 | Sodium cacodylate (H2O)3 | | |
| 25 | | | 0,8 | Ammonium sulfate | 4 | 0,1 | citric acid | | |
| 26 | | | 0,02 | Calcium chloride | 4,6 | 0,1 | sodium acetate (H2O)3 | 30 % v/v | MPD |

Fig. 3b

| No. # | % w/v | Polymer | M | Salt | pH | M | Buffer | Conc | Additive |
|---|---|---|---|---|---|---|---|---|---|
| 27 | 20 | PEG 3350 | | | 6,9 | 0,2 | sodium thiocyanate | | |
| 28 | | | 1 | Ammonium phosphate monobasic | 5,6 | 0,1 | sodium citrate | | |
| 29 | 20 | PEG 6000 | | | 9 | 0,1 | bicine | | |
| 30 | 30 | PEG 400 | 0,2 | Sodium citrate tribasic (H2O)2 | 8,5 | 0,1 | TRIS | | |
| 31 | 10 | PEG 8000 | | | 7,5 | 0,1 | HEPES | 8% v/v | ethylene glycol |
| 32 | 28 | PEG 400 | 0,2 | Calcium chloride | 7,5 | 0,1 | HEPES | | |
| 33 | 5 | PEG 8000 | | | 7 | 0,1 | Sodium cacodylate (H2O)3 | 40% v/v | MPD |
| 34 | | | 1,5 | Lithium sulfate | 7,5 | 0,1 | HEPES | | |
| 35 | 5 | PEG 1000 | | | 5,2 | 0,1 | phosphate citrate | 40% v/v | Ethanol |
| 36 | 25 | PEG 4000 | 0,2 | Ammonium sulfate | 4,6 | 0,1 | sodium acetate (H2O)3 | | |
| 37 | 8 | PEG 4000 | | | 4,6 | 0,1 | sodium acetate (H2O)3 | | |
| 38 | | | 0,2 | Magnesium acetate (H2O)4 | 6,5 | 0,1 | Sodium cacodylate (H2O)3 | 30% v/v | MPD |
| 39 | 10 | PEG 8000 | 0,2 | Magnesium chloride | 7 | 0,1 | TRIS | | |
| 40 | 30 | PEG 8000 | 0,2 | Sodium acetate (H2O)3 | 6,5 | 0,1 | Sodium cacodylate (H2O)3 | | |
| 41 | 20 | PEG 6000 | | | 5 | 0,1 | citric acid | | |

Fig. 3c

| No. # | % w/v | Polymer | M | Salt | pH | M | Buffer | Conc | Additive |
|---|---|---|---|---|---|---|---|---|---|
| 42 | | | 4 | Sodium formate | | | | | |
| 43 | 50 | PEG 200 | 0,2 | Magnesium chloride | 6,6 | 0,1 | Sodium cacodylate (H2O)3 | | |
| 44 | | | 2 | Sodium formate | 4,6 | 0,1 | sodium acetate (H2O)3 | | |
| 45 | | | | | 6,5 | 1,6 | sodium citrate | | |
| 46 | | | 0,8 | Sodium phosphate monobasic (H2O) | 7,5 | 0,1 | HEPES | 0,8 M | Potassium phosphate monobasic |
| 47 | 20 | PEG 3350 | | | 8,3 | 0,2 | tripotassium citrate monohydrate | | |
| 48 | 20 | PEG 8000 | 0,05 | Potassium phosphate monobasic | | | | | |

Fig. 3d

CRYSTALLIZATION MEDIA

CROSS-REFERENCE TO RELATED APPLICATIONS

The present application claims the benefit of U.S. Ser. No. 61/297,027, which was filed on Jan. 21, 2010, the entire contents of which are incorporated herein by reference.

FIELD OF THE INVENTION

The present invention relates to solutions that are useful in the crystallization of molecules, especially macromolecules such as proteins.

BACKGROUND OF THE INVENTION

Macromolecular X-ray crystallography is an essential tool in modern drug discovery and molecular biology. Using X-ray crystallographic techniques, the three-dimensional structures of biological macromolecules, such as proteins, nucleic acids, and their various complexes, can be determined at practically atomic level resolution from X-ray diffraction data.

One of the first and most important steps in the X-ray crystal structure determination of a target macromolecule is to grow large, well diffracting crystals of the macromolecule. As the techniques for collecting and analyzing X-ray diffraction data have become more rapid and automated, crystal growth has become a rate limiting step in the structure determination process.

Vapor diffusion is the most widely used technique for crystallization in modern macromolecular X-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir of crystallization solvent either by hanging the drop from a glass cover slip or by sitting the drop on a pedestal above the level of the solvent in the reservoir. Over time, the crystallization drop and the reservoir solutions equilibrate via vapor diffusion of volatile chemical species. Supersaturating concentrations of the macromolecule are achieved, resulting in crystallization of the macromolecule sample in the drop.

Liquid-liquid diffusion is another technique form, which include bringing a solution of the target molecule in contact with a liquid solvent also referred to as crystallization solvent.

Examples of devices and methods for Vapor diffusion and/or liquid-liquid diffusion techniques are disclosed in EP 1 119 654, U.S. Pat. No. 6,409,832, US 2003/61687, WO 2008/000276 and co-pending patent applications USP 61/154,527 and USP 61/169,987.

The process of growing biological macromolecule crystals remains, however, a highly empirical process. Macromolecular crystallization is dependent on a host of experimental parameters, including; pH, temperature, the concentration of salts in the crystallization drop, the concentration of the macromolecule to be crystallized, and the concentration of the precipitating agent (of which there are hundreds). In particular, the choice of solute conditions in which to grow crystals continues to be a matter for empirical determination. Consequently, the ability to rapidly and easily generate many crystallization trials is important in determining the ideal conditions for crystallization. Sets of preformulated crystallization solutions has been developed in order to rapidly and easily generate many crystallization trials e.g. as described in EP 1 119 654.

However there still is a need for new and improved sets of preformulated crystallization solutions.

BRIEF DESCRIPTION OF THE DRAWINGS

FIGS. 1a-1e are Table I showing the Crystallization Solution Set I.
FIGS. 2a-2b are Table II showing the Crystallization Solution Set II.
FIGS. 3a-3d are Table III showing the Crystallization Solution Set III.

THE INVENTION

The present invention provides solutions (hereinafter referred to as crystallization solutions) useful for crystallizing macromolecules and other molecules, especially proteins.

The set of crystallization solutions of the inventions comprising a plurality of crystallization solutions of Crystallization Solution Set I, a plurality of crystallization solutions of Crystallization Solution Set II or a plurality of crystallization solutions of Crystallization Solution Set III.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The Crystallization Solution Set I is shown in table I, The Crystallization Solution Set II is shown in table II, The Crystallization Solution Set III is shown in table III.

The set of crystallization solutions of Crystallization Solution Set I are particularly suited for dialysis based crystallization (Salt in, Salt-out). Accordingly sets of crystallization solutions of Crystallization Solution Set I are suitably for performing dialysis based crystallization screens. Such sets are also referred to by the term "dialysis screens".

Dialysis is not widely used for protein crystallization recently due to a lack of good high throughput platforms. This problem has been addressed and alleviated by the present invention. The dialysis screens of the invention provide high throughput platforms for dialysis based crystallization. The screen is preferably designed to contain a) conditions that have high ionic strength, thereby crystallizing the proteins by salting out and b) conditions that have low ionic strength, thereby facilitating crystallization by salting in.

In particular using low ionic strength sparse matrix screens for crystallization is unique to this invention—and the advantage is that it allows crystallization of proteins in the salting in region (at low ionic strength proteins have low solubility due to lack of ions that can shield off surface charges of the proteins).

The screen may also feature USP grade chemicals as mentioned below to minimize impurities that might interfere with crystallization.

In one embodiment the set of crystallization solutions comprises at least 5 different of crystallization solutions of Crystallization Solution Set I, such as at least 10 different of crystallization solutions of Crystallization Solution Set I, such as at least 15 different of crystallization solutions of Crystallization Solution Set I, such as at least 25 different of crystallization solutions of Crystallization Solution Set I, such as at least 50 different of crystallization solutions of Crystallization Solution Set I.

In one embodiment the set of crystallization solutions comprises at least one of crystallization solution of Crystallization Solution Set I with a low ionic strength and at least one of a crystallization solution of Crystallization Solution Set I with a high ionic strength, preferably at least 2 times, such as at least 3 times, such as at least 4 times higher than the ionic strength of at least one of the crystallization solution with low ionic strength.

In one embodiment the set of crystallization solutions comprises at least 2, such as at least 3, such as at least 4, such as at least 5 of crystallization solutions of Crystallization Solution Set I with different concentration of polymer.

In one embodiment the set of crystallization solutions comprises at least 2, such as at least 3, such as at least 4, such as at least 5 of crystallization solutions of Crystallization Solution Set I with different concentration of salt.

In one embodiment the set of crystallization solutions comprises at least 2, such as at least 3, such as at least 4, such as at least 5 of crystallization solutions of Crystallization Solution Set I with different types of salt.

In one embodiment the set of crystallization solutions comprises at least 2, such as at least 3, such as at least 4, such as at least 5 of crystallization solutions of Crystallization Solution Set I with different buffers.

In one embodiment the set of crystallization solutions comprises at least 2, such as at least 3, such as at least 4, such as at least 5 of crystallization solutions of Crystallization Solution Set I with different concentration of buffers.

In one embodiment the set of crystallization solutions comprising of crystallization solutions of Crystallization Solution Set I is adapted to be used for dialysis based crystallization.

The crystallization solutions of respectively Crystallization Solution Set II and Crystallization Solution Set III are highly useful for vapour-liquid diffusion based crystallization and/or liquid-liquid diffusion based crystallization. In the particularly crystallization solutions of respectively Crystallization Solution Set II and Crystallization Solution Set III are highly useful for liquid-liquid diffusion based crystallization. Accordingly sets of crystallization solutions of Crystallization Solution Set II or of Crystallization Solution Set III are suitably for performing vapour-liquid diffusion screens and/or liquid-liquid diffusion screens. Sets of crystallization solutions of Crystallization Solution Set II are also referred to by the term "PolyPure screens". Sets of crystallization solutions of Crystallization Solution Set III are also referred to by the term "Smart screens".

The Crystallization Solution Set II provides at least 48 crystallization conditions that are particularly likely to generate gradients across a channel or capillary that would facilitate crystallization.

Furthermore, each of these 48 crystallisation conditions have 6 different molecular weight of PEGs, which may result in waves of PEGs evolving through a capillary system (due to the different diffusion coefficients of the different molecular weight PEGs). A novel feature of these PolyPure screens is that they are highly applicably for crystallization using liquid-liquid diffusion products such as a Crystal Former.

The PEGs can be USP grade to minimize any contaminants that remain from the polymerization process.

In one embodiment the PolyPure screens or the Smart screens are applied for screening the molecular weight space of polymers by including multiple different molecular weight polymers in each condition.

In one embodiment the PolyPure screens or the Smart screens are applied for screening using any kind of crystallization techniques, that sample the effect of many different polymers (such as PEG) simultaneously by combining them together. The screening might sample the effect of different types of polymers (different monomers or different end groups), or the effect of different molecular weights of the same polymer or both at the same time.

PolyPure screens or the Smart may involve a polymer mix, a salt, a buffer, and one or more additives. An example is the PurePEG screen. However, they could also include only a polymer mix, which the user could mix with other components.

An advantage is that one dimension of the multidimensional crystallization screening space, namely molecular weight of polymers, is reduced to be sampled fully in a single experiment.

In one embodiment the set of crystallization solutions comprises at least 5 different of crystallization solutions of Crystallization Solution Set II, such as at least 10 different of crystallization solutions of Crystallization Solution Set II, such as at least 15 different of crystallization solutions of Crystallization Solution Set II, such as at least 25 different of crystallization solutions of Crystallization Solution Set II, such as at least 40 different of crystallization solutions of Crystallization Solution Set II.

In one embodiment the set of crystallization solutions comprises at least 2, such as at least 3, such as at least 4, such as at least 5 of crystallization solutions Crystallization Solution Set II with different concentration of polymer.

In one embodiment the set of crystallization solutions comprises at least 2, such as at least 3, such as at least 4, such as at least 5 of crystallization solutions Crystallization Solution Set II with different concentration of salt.

In one embodiment the set of crystallization solutions comprises at least 2, such as at least 3, such as at least 4, such as at least 5 of crystallization solutions Crystallization Solution Set II with different types of salt.

In one embodiment the set of crystallization solutions comprises at least 2, such as at least 3, such as at least 4, such as at least 5 of crystallization solutions Crystallization Solution Set II with different buffers.

In one embodiment the set of crystallization solutions comprises at least 2, such as at least 3, such as at least 4, such as at least 5 of crystallization solutions Crystallization Solution Set II with different concentration of buffers.

In one embodiment the set of crystallization solutions comprising of crystallization solutions Crystallization Solution Set II is adapted to be used for protein crystallization using liquid-liquid technique.

The Crystallization Solution Set III provides at least 48 crystallization conditions that are particularly likely to generate gradients across a channel or capillary that would facilitate crystallization.

In one embodiment set of crystallization solutions comprises at least 5 different of crystallization solutions of Crystallization Solution Set III, such as at least 10 different of crystallization solutions of Crystallization Solution Set III, such as at least 15 different of crystallization solutions of Crystallization Solution Set III, such as at least 25 different of crystallization solutions of Crystallization Solution Set III, such as at least 40 different of crystallization solutions of Crystallization Solution Set III.

In one embodiment the set of crystallization solutions comprises at least 2, such as at least 3, such as at least 4, such as at least 5 of crystallization solutions Crystallization Solution Set III with different concentration of polymer.

In one embodiment the set of crystallization solutions comprises at least 2, such as at least 3, such as at least 4, such as at least 5 of crystallization solutions Crystallization Solution Set III with different concentration of salt.

In one embodiment the set of crystallization solutions comprises at least 2, such as at least 3, such as at least 4, such as at least 5 of crystallization solutions Crystallization Solution Set III with different types of salt.

In one embodiment the set of crystallization solutions comprises at least 2, such as at least 3, such as at least 4, such as at least 5 of crystallization solutions Crystallization Solution Set III with different buffers.

In one embodiment the set of crystallization solutions comprises at least 2, such as at least 3, such as at least 4, such as at least 5 of crystallization solutions Crystallization Solution Set III with different concentration of buffers.

In one embodiment the set of crystallization solutions comprising of crystallization solutions Crystallization Solution Set III is adapted to be used for protein crystallization using liquid-liquid technique.

The present invention also provides kits including a plurality of crystallization solutions of the present invention and at least one crystallization device, such as a crystallization plate that preferably comprises a plurality of reservoirs. In one embodiment the crystallization solutions of the crystallization solution set(s) are disposed within the reservoirs of the crystallization plates.

In principle all type of crystallisation devices for diffusion crystallization may be applied. The crystallisation device comprises at least one site for a macromolecule solution and at least one site for a of crystallization solution. In case the crystallisation device comprises only one or a few site for of crystallization solutions the kit of the invention comprises several crystallisation devices.

Examples of useful crystallization devices are any of the crystallization devices disclosed in U.S. Pat. No. 6,267,935, in EP 1 119 654, in U.S. Pat. No. 6,409,832, in US 2003/61687, in WO 2008/000276 and/or in co-pending patent applications USP 61/154,527 and/or USP 61/169,987.

In one embodiment the kit of the invention comprises one or more crystallization plates with a plurality of reservoirs. Preferably the crystallization solutions are disposed within the reservoirs of the crystallization plates which can therefore be immediately used to conduct crystallization experiments. Any crystallization plates can be included in the kits of the present invention, including, by way of non-limiting example:

Examples of specifically preferred crystallization devices are Hampton Research plate models VDX, Linbro, Costar, Cryschem, Q-Plate, Q-Plate II and Crystal Clear Strips; Charles Supper Co. sitting drop plates and ICN Linbro model, the Crystal Former and XZ™ plate marketed and sold by Microlytic ApS, Denmark/Microlytic North America Inc. USA.

Thus, the present invention provides solutions and kits that permit a large number of crystallization conditions to be easily and simultaneously tested in order to identify crystallization conditions under which a target molecule, especially a biological macromolecule such as a protein, can be crystallized.

The following abbreviations are used: CAPS: 3-(cyclohexylamino)-l-propanesulfonic acid; CHES: 2-(N-cyclohexylamino) ethanesulfonic acid; BEPES: N-(2-hydroxyethyl)piperazine-N'-(2-ethanesulfonic acid); NMS: 2-(N-morpholino)ethanesulfonic acid; MNIE: monomethyl ether; OAc: acetate; PEG: polyethylene glycol; Tris: tris(hydroxymethyl)aminomethane.

All of the crystallization solutions are made with ultrapure ASTM Type I water, and sterile-filtered into sterile tubes. The sterile crystallization solutions should be stored at room temperature. The following stock solutions may be utilized to formulate the crystallization solutions.

Acetate pH 4.5. 1 M acetic acid and 1 M sodium acetate solutions are mixed together to make a pH 4.5 acetate stock solution. A 10-fold dilution of this stock solution is used in the final crystallization solution formulations, if required.

Cacodylate pH 6.5. A 1 M sodium cacodylate stock solution is adjusted to pH 6.5 with concentrated (37%) HCL A 10-fold dilution of this stock solution is used in the final crystallization solution formulations, if required.

CAPS pH 10.5. A 1 M CAPS stock solution is adjusted to pH 10.5 with 50% (w/v) NaOH. A 10-fold dilution of this solution is used in the final crystallization solution formulations, if required.

CBES pH 9.5. A 1 M CBES stock solution is adjusted to pH 9.5 with 50% NaOH. A 10-fold dilution of this stock solution is used in the final crystallization solution formulations, if required.

Citrate pH 5.5. 0.5 M citric acid and 0.5 M sodium citrate solutions are mixed together to make a pH 5.5 citrate stock solution. A 5-fold dilution of this stock solution is used in the final crystallization solution formulations, if required.

HEPES pH 7.5. A 1 M HEPES stock solution is adjusted to pH 7.5 with 50% NaOH. A 10-fold dilution of this stock solution is used in the final crystallization solution formulations, if required.

Imidazole pH 8.0. A 1 M imidazole stock solution is adjusted to pH 8.0 with concentrated HCL A 10-fold dilution of this stock solution is used in the final crystallization solution formulations, if required.

NMS pH 6.0. A 1 M MES stock solution is adjusted to pH 6.0 with concentrated HCl. A 10-fold dilution of this stock solution is used in the final crystallization solution formulations, if required.

Na/K phosphate pH 6.2. 0.5 M $Na_2HPO_4$ and 0.5 M $KH_2PO_4$ solutions are mixed together to make a pH 6.2 Na/K phosphate stock solution. A 5-fold dilution of this stock solution is used in the final crystallization solution formulations, if required.

Phosphate-citrate pH 4.2. 0.5 M $Na_2HPO_4$ and 0.5 M citric acid solutions are mixed together to make a pH 4.2 phosphate-citrate stock solution. A 5-fold dilution of this stock solution is used in the final crystallization solution formulations, if required.

Tris pH 7.0 (or pH 8.5). A 1 M Tris base stock solution is adjusted to pH 7.0 or 8.5 with concentrated HCL 10-fold dilutions of these stock solutions are used in the final crystallization solution formulations, if required.

When using the crystallization solutions of the present invention to crystallize a molecule, the molecule should preferably be as highly purified as possible. If the molecule to be crystallized is a protein, preferably the protein should appear greater than 90%, preferably greater than 95%, more preferably greater than 97% pure as determined by silver-stained SDS-PAGE.

In one embodiment, where the molecular sample is a biological macromolecule, such as a protein, the molecular sample should preferably be in as minimal a buffer as possible (i.e., the buffer should contain as few chemical components as possible) to help maintain the biological activity of the macromolecule, and the molecular sample should preferably be at a concentration of 5-15 mg/ml.

The crystallization solutions of the present invention can be used in any crystallization technique. Examples of crystallization techniques for use with the crystallization solutions of the present invention are vapor diffusion, liquid-liquid diffusion and dialysis based crystallization techniques. Vapor diffusion techniques are described, for example, in Gilliland, G. L. & Davies, D. R. (1984) Methods in Enzymol. 104.370-381; McPherson, A. (1990) Eur. J Biochem. 189:1-23 and Weber, P. C. (1991) Adv. in Prot. Chem. 41:1-36. For example, hanging drop crystallization is a vapor diffusion technique that typically utilizes crystallization plates including a plurality of reservoirs, such as those available from Hampton Research (27632 El Lazo Rd., Laguna Niguel, Calif. 92677) and 1CN-Flow (3300 Hyland Ave., Costa Mesa, Calif. 92626). In an exemplary hanging drop crystallization experiment, sealant, such as petroleum jelly or vacuum grease, is applied to the rim of a crystallization plate reservoir and 0.5-1.0 ml of a single crystallization solution of the present invention is pipetted into the reservoir. 1-10 µl (depending on availability) of the macromolecule sample is pipetted onto a siliconized cover slip (plates from Hampton Research and ICN-Flow typically require 22 mm square or round cover slips) and an equal volume of the crystallization solution that is in the reservoir is added to the sample drop on the cover slip and mixed by repeatedly aspirating and dispensing the solution from the pipettor. The cover slip is inverted and sealed over the reservoir.

Similarly, sitting drop crystallization is a type of vapor diffusion technique that utilizes sitting drop crystallization plates, including a plurality of reservoirs within each of which is located a pedestal that includes a sample depression within its upper end, such as those available from Charles Supper Co. (15 Tech Circle, Natick, Mass. 01760). In an example sitting drop crystallization experiment utilizing the crystallization solutions of the present invention, 0.5-1.0 ml of a single crystallization solution are pipetted into a reservoir of a sitting drop crystallization plate and 1-10 µl of the sample are pipetted into the sample depression of the sitting drop pedestal. An equal volume of the crystallization solution that is in the reservoir is added to the sample drop and mixed. This procedure can be repeated, utilizing a different crystallization solution in each of the reservoirs. The reservoirs can be individually sealed with sealant and cover slips, or the entire sitting drop plate can be sealed with a single piece of clear sealing tape after application of sample to all wells has been completed.

By way of non-limiting example, other crystallization techniques that can utilize the crystallization solutions of the present invention include sandwich drop vapor diffusion which is similar to hanging drop and sitting drop vapor diffusion, except that the crystallization drop is contacted on two sides by glass or plastic surfaces. See, e.g., A. McPherson, Eur. J Biochem. 189:1-23 (1990). Sandwich drop crystallization plates are available from Hampton Research and ICN-Flow. In the technique of crystallization using oils, the rate of equilibration by vapor diffusion can be modulated by placing a layer of oil between the crystallization drop and the reservoir (see, e.g., Chayen, N. E. (1997) J AppL Cryst. 30:198-202). Alternatively, oils can be used to seal microbatch crystallization drops, in the absence of a larger reservoir of crystallization solution (see, e.g., Chayen N. E. et al. (1990) 3 AppL Cryst. 23:297-302). In the technique of capillary crystallization, layers of sample solution and crystallization solution can be deposited in a capillary 0.5-1.0 mm in diameter, either with an air space between the solutions or with a direct liquid-liquid interface. Crystallization occurs by vapor diffusion or liquid-liquid diffusion inside the capillary.

Other examples of useful liquid-liquid diffusion techniques are described in WO 2008/000276.

If the supply of sample permits, it is preferable to set up the crystallizations in duplicate, with one set of crystallizations placed at a first higher temperature (typically from about 16° C. to about 40° C.), and the other one at a second lower temperature, such as about 4° C. Regardless of the crystallization method used, the crystallization trials should preferably be stored in a place free of vibrations or mechanical shock, which could result in premature precipitation.

Typically, observations of crystallization trials are recorded every one or two days. The crystallization trials can for example be viewed under a stereo microscope at 10-100× magnification. If less than ten percent of the samples in the crystallization screen do not show heavy precipitate after one day, it may be desirable to increase the concentration of the sample molecule. If more than fifty percent of the samples in the crystallization screen show heavy precipitate after one day, it may be desirable to reduce the sample molecule concentration.

Crystals suitable for X-ray data collection are preferably 0.1 mm or greater in their smallest dimension, and have preferably clean and/or sharp edges. Viewing the crystallization trials between crossed polarizers often aids in distinguishing microcrystals from amorphous precipitate. Except for the rather unusual occurrence of a cubic space group, X-ray diffraction quality biological macromolecule crystals are bireffingent (have more than one refractive index), and turn polarized light. When rotated between crossed polarizers, the intensity and/or color of light transmitted through birefringent crystals will change, with a periodicity of 900. Amorphous precipitates will not transmit and turn polarized light.

While the preferred embodiment of the invention has been illustrated and described, it will be appreciated that various changes can be made therein without departing from the spirit and scope of the invention.

The invention claimed is:

1. A set of crystallization solutions comprising a plurality of crystallization solutions of Crystallization Solution Set II wherein the Crystallization Solution Set II consists of:
   (1) A1 containing 0.3 M ammonium chloride, 0.1 M citric acid, 22.5% PolyPure PEG 0.3-10 kD and having a pH of 4,
   (2) A2 containing 0.3 M ammonium formate, 0.1 M potassium nitrate, 22.5% PolyPure PEG 0.3-10 kD and having a pH of 6.6,
   (3) B1 containing 0.3 M ammonium nitrate, 0.1 M sodium citrate tribasic dihydrate, 22.5% PolyPure PEG 0.3-10 kD and having a pH of 5.9,
   (4) B2 containing 0.3 M ammonium phosphate monobasic, 0.1 M MES monohydrate, 22.5% PolyPure PEG 0.3-10 kD and having a pH of 5.7,
   (5) C1 containing 0.3 M ammonium sulfate, 0.1 M BIS-TRIS, 22.5% PolyPure PEG 0.3-10 kD and having a pH of 6.8,
   (6) C2 containing 0.3 M di-ammonium tartrate, 0.1 M sodium acetate trihydrate, 22.5% PolyPure PEG 0.3-10 kD and having a pH of 5.8,
   (7) D1 containing 0.3 M cadmium chloride, 0.1 M sodium acetate trihydrate, 22.5% PolyPure PEG 0.3-10 kD and having a pH of 3.7,
   (8) D2 containing 0.3 M cadmium sulfate, 0.1 M imidazole, 22.5% PolyPure PEG 0.3-10 kD and having a pH of 4.6,
   (9) E1 containing 0.3 M caesium chloride, 0.1 M HEPES, 22.5% PolyPure PEG 0.3-10 kD and having a pH of 7.6,
   (10) E2 containing 0.3 M calcium acetate, 0.1 M BICINE, 22.5% PolyPure PEG 0.3-10 kD and having a pH of 6.4,

(11) F1 containing 0.3 M calcium chloride, 0.1 M BIS-TRIS propane, 22.5% PolyPure PEG 0.3-10 kD and having a pH of 8.5,
(12) F2 containing 0.3 M cobalt(II) chloride hexahydrate, 0.1 M ammonium citrate, 22.5% PolyPure PEG 0.3-10 kD and having a pH of 3.2,
(13) G1 containing 0.3 M di-ammonium hydrogen citrate, 0.1 M magnesium formate, 22.5% PolyPure PEG 0.3-10 kD and having a pH of 4.9,
(14) G2 containing 0.3 M DL-malic acid, 0.1 M sodium cacodylate trihydrate, 22.5% PolyPure PEG 0.3-10 kD and having a pH of 2.9,
(15) H1 containing 0.3 M iron(III) chloride hexahydrate, 0.1 M potassium nitrate, 22.5% PolyPure PEG 0.3-10 kD and having a pH of 1.1,
(16) H2 containing 0.3 M lithium chloride, 0.1 M potassium formate, 22.5% PolyPure PEG 0.3-10 kD and having a pH of 6.3,
(17) A6 containing 0.3 M lithium sulfate monohydrate, 0.1 M CHES, 22.5% PolyPure PEG 0.3-10 kD and having a pH of 9.5,
(18) A7 containing 0.3 M magnesium acetate tetrahydrate, 0.1 M citric acid, 22.5% PolyPure PEG 0.3-10 kD and having a pH of 4.7,
(19) B6 containing 0.3 M magnesium chloride hexahydrate, 0.1 M sodium cacodylate trihydrate, 22.5% PolyPure PEG 0.3-10 kD and having a pH of 5.8,
(20) B7 containing 0.3 M magnesium nitrate hexahydrate, 0.1 M HEPES, 22.5% PolyPure PEG 0.3-10 kD and having a pH of 7.4,
(21) C6 containing 0.3 M magnesium sulfate heptahydrate, 0.1 M potassium formate, 22.5% PolyPure PEG 0.3-10 kD and having a pH of 6.1,
(22) C7 containing 0.3 M nickel(II) chloride hexahydrate, 0.1 M MES monohydrate, 22.5% PolyPure PEG 0.3-10 kD and having a pH of 5.7,
(23) D6 containing 0.3 M potassium bromide, 0.1 M BIS-TRIS, 22.5% PolyPure PEG 0.3-10 kD and having a pH of 6.6,
(24) D7 containing 0.3 M potassium phosphate monobasic, 0.1 M Tris, 22.5% PolyPure PEG 0.3-10 kD and having a pH of 6.1,
(25) E6 containing 0.3 M potassium sodium tartrate tetrahydrate, 0.1 M BICINE, 22.5% PolyPure PEG 0.3-10 kD and having a pH of 8.8,
(26) E7 containing 0.3 M potassium tartrate, 0.1 M imidazole, 22.5% PolyPure PEG 0.3-10 kD and having a pH of 7.3,
(27) F6 containing 0.3 M potassium thiocyanate, 0.1 M ammonium citrate, 22.5% PolyPure PEG 0.3-10 kD and having a pH of 5.8,
(28) F7 containing 0.3 M sodium bromide, 0.1 M sodium cacodylate trihydrate, 22.5% PolyPure PEG 0.3-10 kD and having a pH of 6.5,
(29) G6 containing 0.3 M sodium chloride, 0.1 M Tris, 22.5% PolyPure PEG 0.3-10 kD and having a pH of 8.1,
(30) G7 containing 0.3 M sodium fluoride, 0.1 M CHES, 22.5% PolyPure PEG 0.3-10 kD and having a pH of 9.6,
(31) H6 containing 0.3 M sodium formate, 0.1 M citric acid, 22.5% PolyPure PEG 0.3-10 kD and having a pH of 4.5,
(32) H7 containing 0.3 M sodium iodide, 0.1 M sodium acetate trihydrate, 22.5% PolyPure PEG 0.3-10 kD and having a pH of 4.7,
(33) A11 containing 0.3 M sodium malonate, 0.1 M sodium citrate tribasic dihydrate, 22.5% PolyPure PEG 0.3-10 kD and having a pH of 6.8,
(34) A12 containing 0.3 M sodium nitrate, 0.1 M MES monohydrate, 22.5% PolyPure PEG 0.3-10 kD and having a pH of 6.1,
(35) B11 containing 0.3 M sodium phosphate monobasic monohydrate, 0.1 M BIS-TRIS, 22.5% PolyPure PEG 0.3-10 kD and having a pH of 5.8,
(36) B12 containing 0.3 M sodium sulfate, 0.1 M BIS-TRIS propane, 22.5% PolyPure PEG 0.3-10 kD and having a pH of 9.3,
(37) C11 containing 0.3 M sodium thiocyanate, 0.1 M HEPES, 22.5% PolyPure PEG 0.3-10 kD and having a pH of 7.8,
(38) C12 containing 0.3 M succinic acid, 0.1 M imidazole, 22.5% PolyPure PEG 0.3-10 kD and having a pH of 3.4,
(39) D11 containing 0.3 M tri-methylamine N-oxide, 0.1 M BICINE, 22.5% PolyPure PEG 0.3-10 kD and having a pH of 8.6,
(40) D12 containing 0.3 M tri-potassium citrate, 0.1 M BIS-TRIS propane, 22.5% PolyPure PEG 0.3-10 kD and having a pH of 9.8,
(41) E11 containing 10% Jeffamine M-600, 0.1 M HEPES, 22.5% PolyPure PEG 0.3-10 kD and having a pH of 7.5,
(42) E12 containing 0.3 M zinc chloride, 0.1 M magnesium formate, 22.5% PolyPure PEG 0.3-10 kD and having a pH of 5.7,
(43) F11 containing 0.3 M zinc sulfate heptahydrate, 0.1 M sodium citrate tribasic dihydrate, 22.5% PolyPure PEG 0.3-10 kD and having a pH of 4,
(44) F12 containing 0.1 M CHES, 22.5% PolyPure PEG 0.3-10 kD and having a pH of 9.9,
(45) G11 containing 0.1 M imidazole, 22.5% PolyPure PEG 0.3-10 kD and having a pH of 6.6,
(46) G12 containing 0.1 M magnesium formate, 22.5% PolyPure PEG 0.3-10 kD and having a pH of 5.9,
(47) H11 containing 0.1 M sodium acetate trihydrate, 22.5% PolyPure PEG 0.3-10 kD and having a pH of 4.7, and
(48) H12 containing 0.1 M Tris, 22.5% PolyPure PEG 0.3-10 kD and having a pH of 8.1.

2. The set of crystallization solutions of claim 1, wherein the set of crystallization solutions comprises at least 5 of the crystallization solutions of Crystallization Solution Set II.

3. The set of crystallization solutions of claim 1, wherein the set of crystallization solutions comprises at least 2 of the crystallization solutions of Crystallization Solution Set II with different concentration of polymer.

4. The set of crystallization solutions of claim 1, wherein the set of crystallization solutions comprises at least 2 of the crystallization solutions of Crystallization Solution Set II with different concentration of salt.

5. The set of crystallization solutions of claim 1, wherein the set of crystallization solutions comprises at least 2 of the crystallization solutions of Crystallization Solution Set II with different types of salt.

6. The set of crystallization solutions of claim 1, wherein the set of crystallization solutions comprises at least 2 of the crystallization solutions of Crystallization Solution Set II with different buffers.

7. The set of crystallization solutions of claim 1, wherein the set of crystallization solutions comprises at least 2 of the crystallization solutions of Crystallization Solution Set II with different concentration of buffers.

8. The set of crystallization solutions of claim 1, wherein the set of crystallization solutions comprises at least 2 of the crystallization solutions of Crystallization Solution Set II and is suitable for liquid-liquid protein crystallization.

9. A kit comprising at least one crystallization device and a set of crystallization solutions according to claim 1.

* * * * *